(12) United States Patent
Duqi et al.

(10) Patent No.: US 10,125,009 B2
(45) Date of Patent: Nov. 13, 2018

(54) MULTI-CHAMBER MULTI-DEVICE TRANSDUCER MODULE, APPARATUS INCLUDING THE TRANSDUCER MODULE AND METHOD OF MANUFACTURING THE TRANSDUCER MODULE

(71) Applicant: STMICROELECTRONICS S.R.L., Agrate Brianza (IT)

(72) Inventors: Enri Duqi, Milan (IT); Mikel Azpeitia Urquia, Milan (IT); Lorenzo Baldo, Bareggio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 15/636,380

(22) Filed: Jun. 28, 2017

(65) Prior Publication Data
US 2018/0118558 A1    May 3, 2018

(30) Foreign Application Priority Data
Oct. 31, 2016    (IT) .......... 102016000109761

(51) Int. Cl.
*B81B 3/00* (2006.01)
*B81C 1/00* (2006.01)
*B81B 7/00* (2006.01)

(52) U.S. Cl.
CPC .......... *B81B 3/0021* (2013.01); *B81B 7/0077* (2013.01); *B81C 1/00158* (2013.01); *B81C 1/00269* (2013.01); *B81B 2201/0235* (2013.01); *B81B 2201/0242* (2013.01); *B81B 2201/0264* (2013.01); *B81B 2207/012* (2013.01)

(58) Field of Classification Search
CPC ...................................... B81B 3/0021
See application file for complete search history.

(56) References Cited

U.S. PATENT DOCUMENTS

| 2011/0123052 A1 | 5/2011 | Bominaar-Silkens et al. |
| 2012/0033832 A1* | 2/2012 | van Lippen ......... B81C 1/00182 381/111 |
| 2015/0158722 A1 | 6/2015 | Lim et al. |

FOREIGN PATENT DOCUMENTS

| EP | 2320678 A1 | 5/2011 |
| WO | 2010103410 A1 | 9/2010 |

* cited by examiner

*Primary Examiner* — William Harriston
(74) *Attorney, Agent, or Firm* — Seed Intellectual Property Law Group LLP (57) ABSTRACT

Method of manufacturing a transducer module, comprising the steps of: forming, on a substrate, a first MEMS transducer, in particular a gyroscope, and a second MEMS transducer, in particular an accelerometer, having a suspended membrane; forming, on the substrate, a conductive layer and defining the conductive layer in order to provide, simultaneously, at least one conductive strip electrically coupled to the first MEMS transducer and the membrane of the second MEMS transducer.

23 Claims, 10 Drawing Sheets

MULTI-CHAMBER MULTI-DEVICE TRANSDUCER MODULE, APPARATUS INCLUDING THE TRANSDUCER MODULE AND METHOD OF MANUFACTURING THE TRANSDUCER MODULE

BACKGROUND

Technical Field

The present disclosure relates to a transducer module, to an apparatus including the transducer module, and to a method of manufacturing the transducer module.

Description of the Related Art

As is known, a transducer of a MEMS (Micro-Electro-Mechanical System) type comprises a structure for acquisition or detection of an environmental signal or inertial signal and means for generating an electrical quantity representing, or correlated to, the acquired or detected signal.

Known transducers include, for example, pressure sensors, gyroscopes, accelerometers, etc. Integration of a plurality of transducers of the same type in an electronic device involves the use of dedicated integrated circuit boards and thus has a considerable impact on the occupation of space.

Further, according to the known art, transducers of different types are difficult to integrate in a package while optimizing organization in space, occupation of area, and costs.

BRIEF SUMMARY

According to the present disclosure, a transducer module, an apparatus including the transducer module, and a method of manufacturing the transducer module are provided. One or more embodiments are directed to a transducer module having a plurality of transducers. According to a further aspect of the present disclosure, the transducer module includes a plurality of chambers that house the plurality of transducers.

BRIEF DESCRIPTION OF THE SEVERAL VIEWS OF THE DRAWINGS

For a better understanding of the present disclosure, preferred embodiments thereof are now described, purely by way of non-limiting example and with reference to the attached drawings, wherein.

DETAILED DESCRIPTION

Figure 1A:
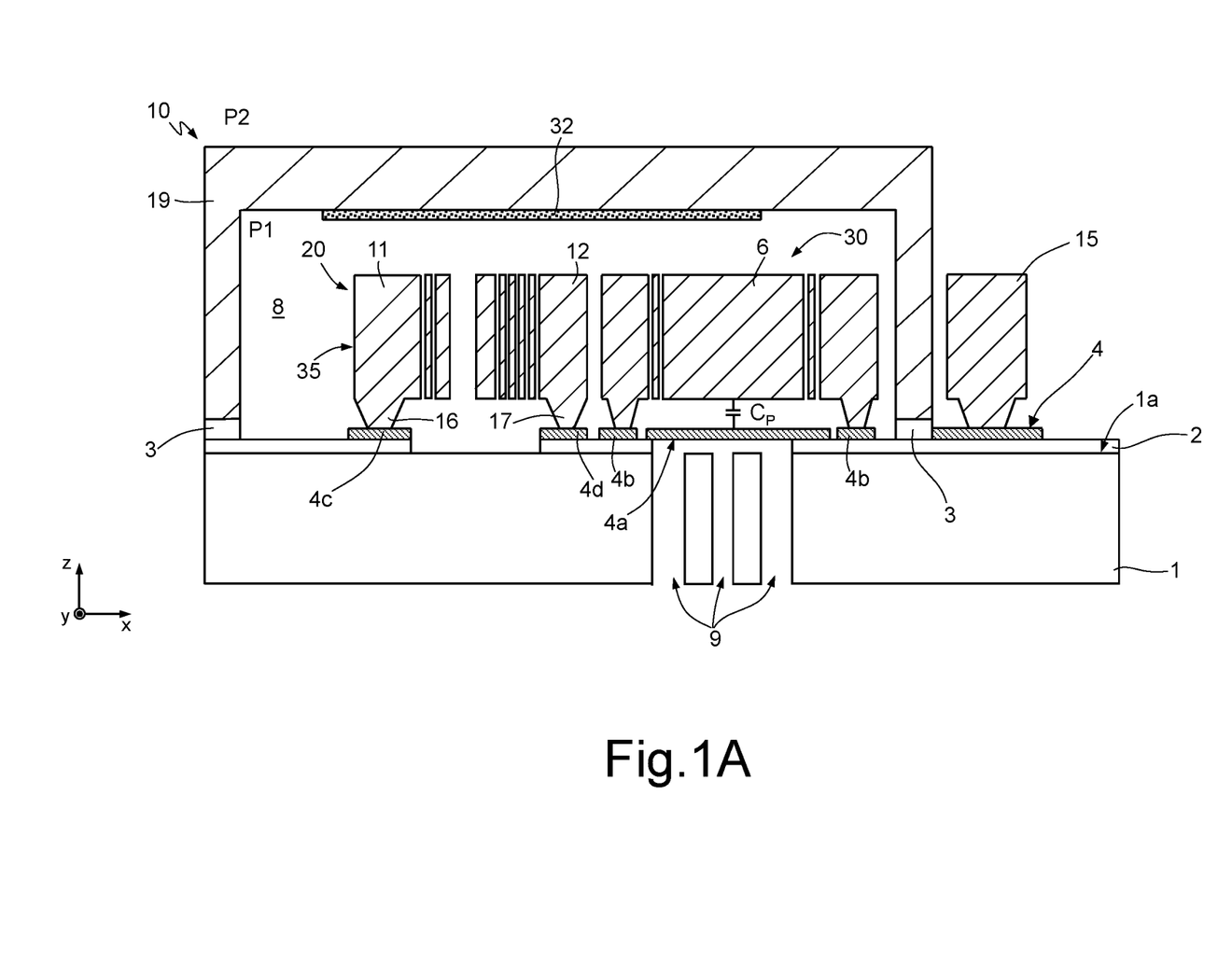
FIG. 1A is a view in lateral section taken along the line of section I-I of FIG. 1B, of a multi-device transducer module according to an embodiment of the present disclosure.
Figure 1B:
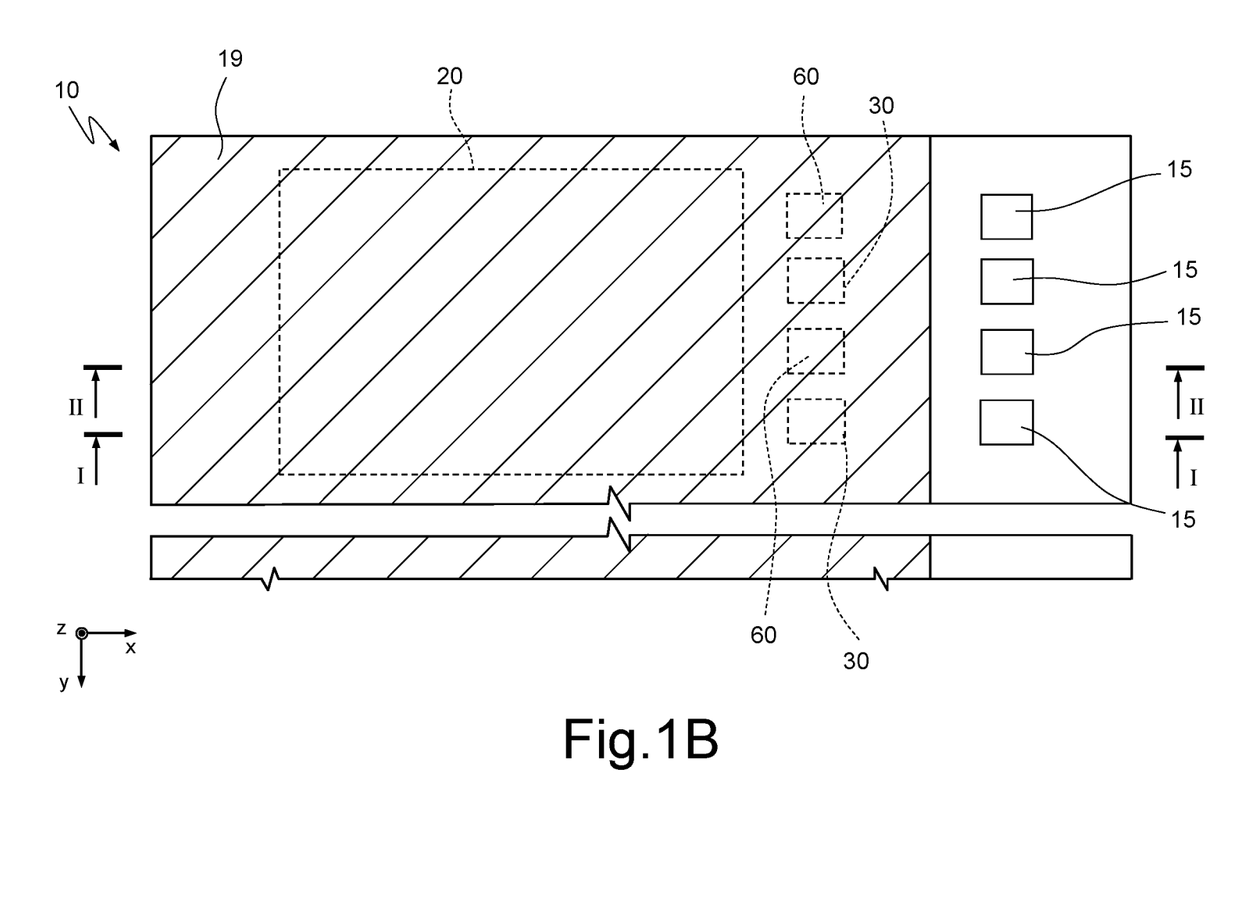
FIG. 1B is a top plan view the transducer module of FIG. 1A.

Represented with reference to FIG. 1A, in a system of spatial coordinates X, Y, and Z, is a transducer module 10 housing a first transducer 20 and a second transducer 30. FIG. 1B is a schematic illustration of the spatial organization of the first transducer 20 and of the second transducer 30 (or, rather, of a plurality of second transducers 30) in top plan view. Other elements of the transducer module 10 of FIG. 1A are not illustrated in FIG. 1B, for simplicity of representation. In an embodiment provided by way of example of the present disclosure, the first transducer 20 is an inertial sensor, in particular a gyroscope, and the second transducer 30 is a sensor of an environmental quantity, in particular a pressure sensor provided with a membrane and based upon a capacitive sensing principle. The first transducer 20 may, alternatively, be an accelerometer.

The first and second transducers 20, 30 are housed in a same chamber 8, defined between a substrate 1 and a cap 19. The cap 19 is coupled to the substrate 1 by coupling regions 3 (bonding regions, or glue, or any suitable bonding material or structure). The chamber 8 is fluidically isolated from the external environment.

A supporting layer 2, of electrically insulating material, extends over a top surface 1a of the substrate 1, inside the chamber 8. The supporting layer 2 may extend also outside the cavity 8.

Extending on the supporting layer 2 is an electrical-connection region 4, made in particular of doped polysilicon (e.g., of an N type). The electrical-connection region 4 is shaped so as to form, in part, conductive strips that provide electrical interconnections with one or more electrical contact terminals 15 (and, in addition or as an alternative, conductive pads), outside the chamber 8. The electrical-connection region 4 further forms the membrane (designated by the reference 4a) of the second transducer 30.

In greater detail, the portion of the electrical-connection region 4 that extends, at least in part, underneath the second transducer 30 is suspended and free to move in the direction Z (via local removal of the supporting layer 2 and of selective regions of the substrate 1). Said membrane 4a, of conductive material, faces a rigid plate 6 (by this term is here meant an element that is relatively rigid with respect to the membrane 4a, which is, instead, flexible). The rigid plate 6 is of conductive epitaxial polysilicon (for example, with a N type doping) and directly faces the membrane 4a, so that the membrane 4a and the rigid plate 6 form facing plates of a capacitor with capacitance $C_P$. Electrical connections 4b are formed by appropriately shaping the electrical-connection region 4 so as to bias, in use, the rigid plate 6. In one embodiment, the membrane 4a, in use, is subject to a force acting in the direction Z (in either sense, according to the difference between a pressure P1 inside the chamber 8 and a pressure P2 outside the chamber 8).

By way of example, a thickness of the conductive region 4 comprised between 0.5 µm and 1.5 µm, in particular 0.9 µm, provides both the function of routing of the electrical signals and the function of deflexion desired by the second transducer 30 (use of the conductive region 4 as flexible membrane). The membrane 4a has, for example, a quadrangular shape, in particular a square shape, with a side comprised between 50 µm and 100 µm, in particular between 70 µm and 90 µm.

In order to set up a connection between a side of the membrane 4a and the environment outside the chamber 8, one or more holes 9 are provided in the substrate 1, in the region where the supporting layer 2 has been removed. The holes 9 extend throughout the thickness (along Z) of the substrate 1 as far as the membrane 4a. In this way, the membrane 4a has a first surface facing the inside of the chamber 8 and subject to the internal pressure P1 and a second surface, opposite to the first surface, facing the environment outside the chamber 8 and subject to the external pressure P2. In use, the membrane 4a undergoes deformation according to a difference in pressure between the environment outside the chamber 8 and the internal environment.

Formation of a plurality of holes 9, instead of a single opening of larger size, presents the advantage of not modifying markedly the stiffness of the substrate in an area corresponding to the second transducer 30.

The first transducer 20 comprises suspended structures that are mobile in one or more directions (here, a stator 11 and a rotor 12), electrically coupled to respective conductive strips 4c, 4d of the electrical-connection region 4, thus forming respective conductive paths towards the external electrical contact terminals 15 of the chamber 8. The stator 11 and the rotor 12 are in electrical contact with the underlying conductive strips 4c, 4d by respective resting bases 16, 17.

To simplify the manufacturing steps, reduce the costs (via reduction of the process masks), and increase the compactness of the transducer module 10, the first and second transducers 20, 30 are formed starting from a common structural region 35, which is defined (e.g., photolithographically in a same process step) to form the stator 11, the rotor 12, and the rigid plate 6 all at the same time. In one embodiment, also the electrical contact terminals 15 are formed in the same manufacturing step.

The transducer module 10 further comprises, optionally, an element 32 that absorbs gas or gas molecules, better known as a "getter". The getter 32 has the function of generating a pressure P1, inside the chamber 8, that is different from (typically lower than) a pressure P2 of the environment outside the chamber 8. The getter 32 is usually of material deposited in the form of a layer, and has the function of absorbing specific gas molecules. Materials used as the getter layer are known, and comprise, for example, metals such as aluminum (Al), barium (Ba), zirconium (Zr), titanium (Ti), vanadium (V), iron (Fe), or corresponding mixtures or alloys such as zirconium-aluminum, zirconium-vanadium-iron, zirconium-nickel, zirconium-cobalt (in particular, a Zr/Co/O alloy).

The getter 32 is, according to one embodiment, a non-evaporable getter (NEG), provided in the form of layer on the inner surface of the cap 19. As is known, during the step of formation of the getter 32, the material of which the getter 32 is made reacts with the surrounding air, enabling formation of a passivation layer (typically, of oxide or oxide/nitride) that coats completely the surface area of the getter 32, rendering it inactive. Activation of the getter 32 occurs following upon hermetic sealing of the first cavity 8 via local activation at high temperature. This activation step may be carried out by locally heating from outside the region of the transducer module 10 corresponding to the area where the getter 32 is arranged (for example, by magnetic induction, or heating using a generic heat source), in order to remove the passivation layer on the getter 32.

Figure 2:
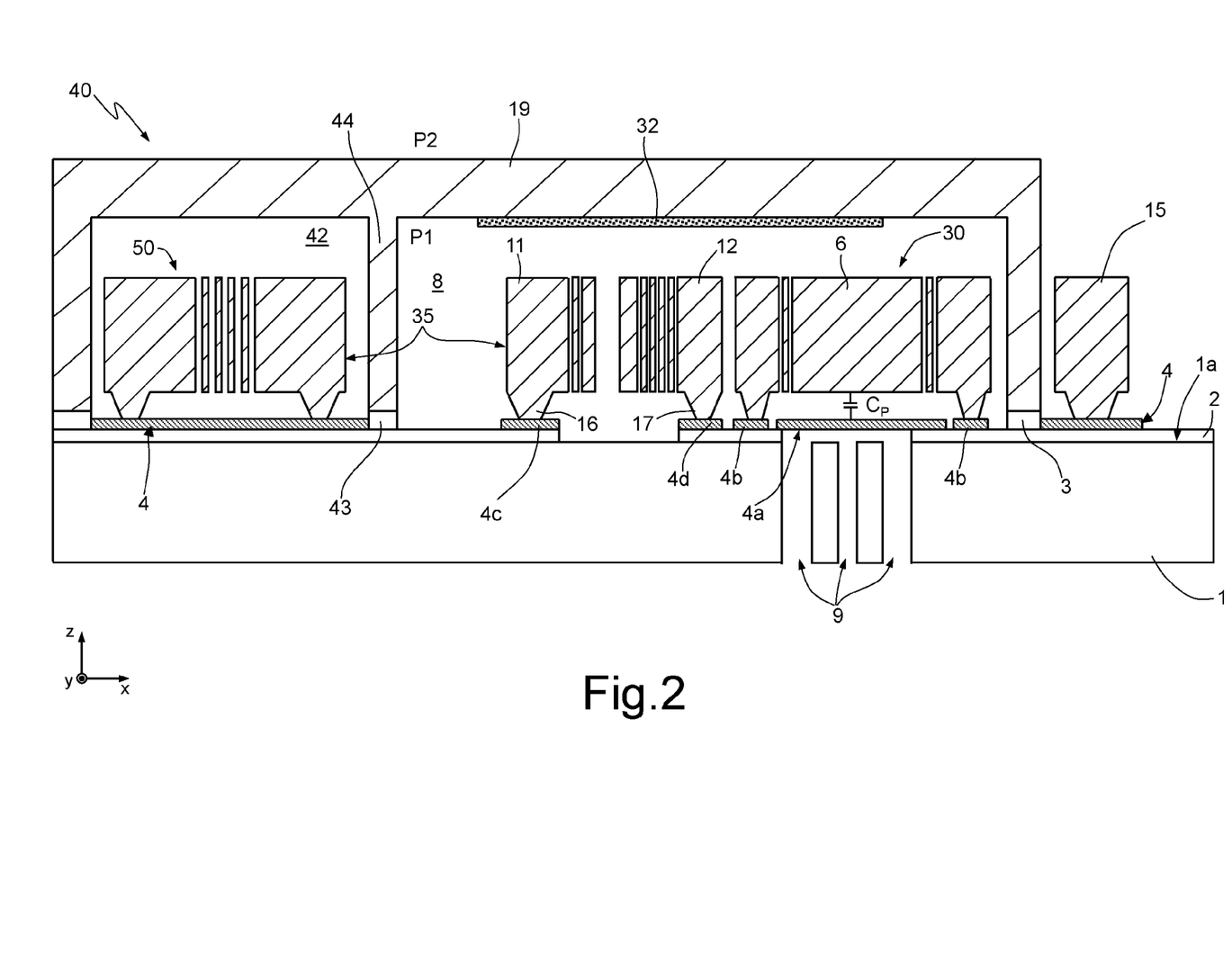
FIG. 2 is a view in lateral section of a multi-chamber multi-device transducer module according to a further embodiment of the present disclosure.

FIG. 2 shows a further embodiment of a transducer module 40 alternative to the transducer module of FIGS. 1A and 1B, according to a further aspect of the present disclosure.

Elements of the transducer module 40 of FIG. 2 that are common to those of the transducer module 10 of FIG. 1A are designated by the same reference numbers and are not described any further.

In particular, the transducer module 40 comprises, in addition to what has been described with reference to the transducer module 10, a third transducer 50, in particular a further inertial sensor, housed in a further chamber 42, which is separate and is fluidically isolated from the chamber 8. The cap 19 is shaped so as to define a first internal cavity and a second internal cavity isolated from one another. When the cap 19 is mounted on the substrate 1, the chambers 8, 42 are separated from one another by a separation wall 44, which extends continuously between the cap 19 and the substrate. The cap 19 is coupled to the substrate 1 also at the wall 44, by a respective coupling region 43, of the same type as the coupling regions 3 described previously.

The inertial sensor 50 is, for example, an accelerometer. Alternatively, the inertial sensor 50 may be a gyroscope. It is in any case evident that the chamber 42 may contain a transducer of any other type, not necessarily an inertial sensor, for example a pressure sensor, an acoustic sensor, and the like.

According to an aspect of the present disclosure, the third transducer 50 is manufactured starting from the same structural layer 35 as the one used for producing the first and second transducers 20, 30, during simultaneous manufacturing steps.

The first, second, and third transducers 20, 30, and 50 are arranged side by side on the substrate 1, in the chambers 8, 42 as described previously. The mutual arrangement of the first, second, and third transducers 20, 30, 50 is defined on the basis of the specifications of layout and electrical interconnection, as well as of the type of transducer effectively used. The embodiment illustrated in FIGS. 1 and 2 is consequently not to be deemed in any way limiting in this regard.

The electrical signal generated at output from the first and second transducers 20, 30 (FIGS. 1A and 1B) and, further, from the third transducer (FIG. 2), are sent to a processing circuit (e.g., an ASIC, not shown), in a per se known manner, which does not form the subject of the present disclosure. The processing circuit may be housed in the chamber 8 and/or in the chamber 42, or else integrated in the substrate 1, or else may be external to the transducer module 10, 40.

According to one embodiment of the present disclosure, which may be applied both to the transducer module 10 of FIG. 1A and to the transducer module 40 of FIG. 2, at least one reference transducer is further present similar to the second transducer 30 but having a perforated membrane. A plurality of reference transducers are illustrated in FIG. 1B, in top plan view, and are designated by the reference number 60.

The one or more reference transducers 60 are arranged in the chamber 8 alongside respective one or more second transducers 30, for example in the direction Y, so as not to increase the dimension, along X, of the transducer module 10, 40.

Figure 3:
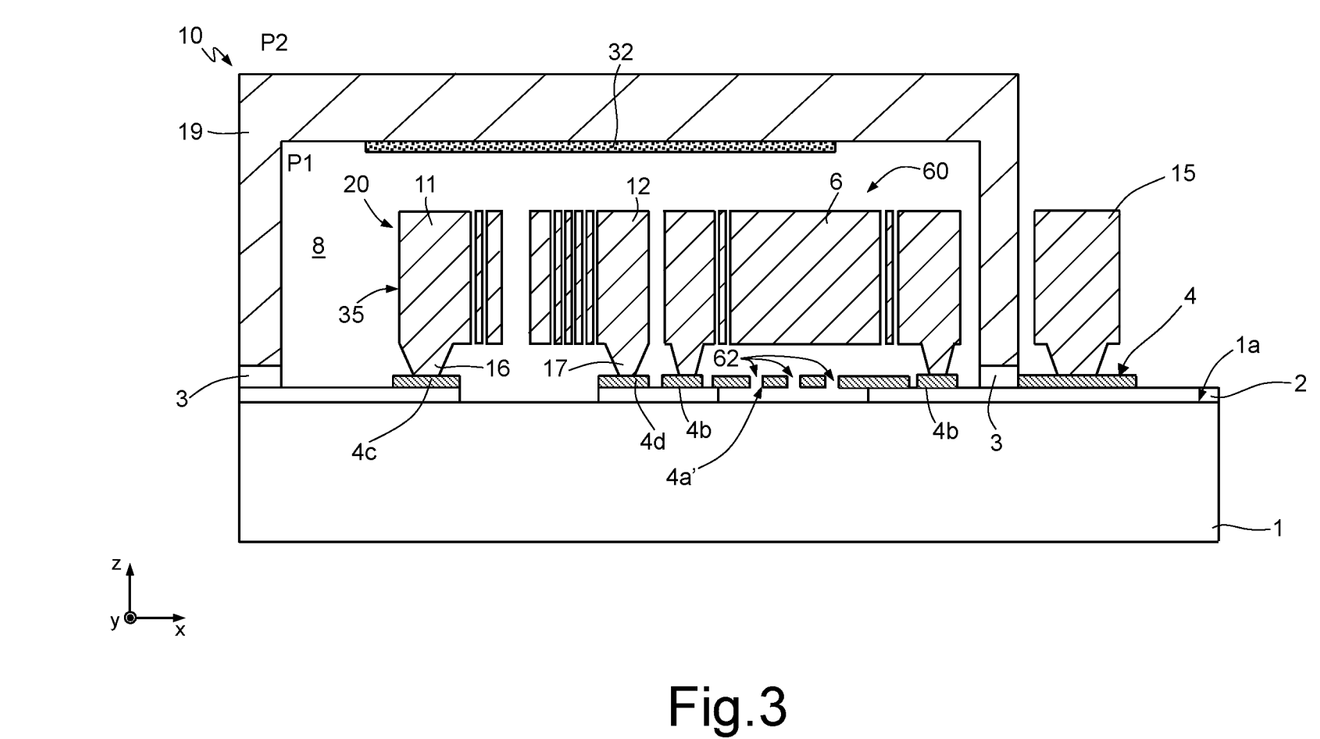
FIG. 3 illustrates the transducer module of FIG. 1 along a different lateral section.

FIG. 3 shows by way of example a cross-sectional view of the transducer module 10 (but what is illustrated applies, in a per se known manner, also to the transducer module 40) taken along the line of section II-II of FIG. 1B, and in particular including a reference transducer 60, according to what has been set forth above.

As may be noted, the reference transducer 60 is altogether similar to the second transducer 30 (elements that are in common are designated by the same reference numbers) and may be manufactured during the same process steps. However, the substrate 1 does not have, in an area corresponding to the reference transducer 60, through openings similar to the holes 9, whereas the membrane 4a' of the reference transducer 60 has one or more through holes 62. The membrane 4a' of the reference transducer 60 is formed in a way similar to the membrane 4a of the second transducer 30, via steps of definition (e.g., photolithographic and etching steps) of the conductive polysilicon layer 4. A further etching step enables formation of the through holes 62. The holes 62 in the membrane 4a' have the function of enabling, during an appropriate step of etching of the supporting layer 2, release of the membrane 4a', so that it is suspended over the substrate 1. The reference transducer 60 has the function of supplying at output an error signal that is exclusively a function of the stresses to which the reference transducer 60 is subjected in use. For this purpose, the reference transducer 60 is not affected by the external pressure P2 and, for this reason, does not have access holes towards the outside of the transducer module 10, 40. The reference signal, or error signal, generated by the reference transducer 60 is sent to the processing circuit (ASIC) and, here, subtracted from the signal of the second transducer 30 to generate a signal where the error component is attenuated. The operations performed by the processing circuit on the transduced signals do not form the subject of the present disclosure and are thus not described any further.

To obtain a good compensation of the error signal, it is possible to provide a number of reference transducers equal to the number of second transducers 30. For example, according to the specific application, it is possible to provide a plurality of second transducers 30, each of which alternates with a respective reference transducer 60.

FIGS. 4-9 show steps of manufacture of the transducer module 10 of FIG. 1A. What is described and illustrated applies, in a per se known manner to the person skilled in the art, to the manufacture of the transducer module 40 of FIG. 2. Possible peculiar aspects regarding manufacture of the transducer module 40 will in any case be specified where desired.

Figure 4:
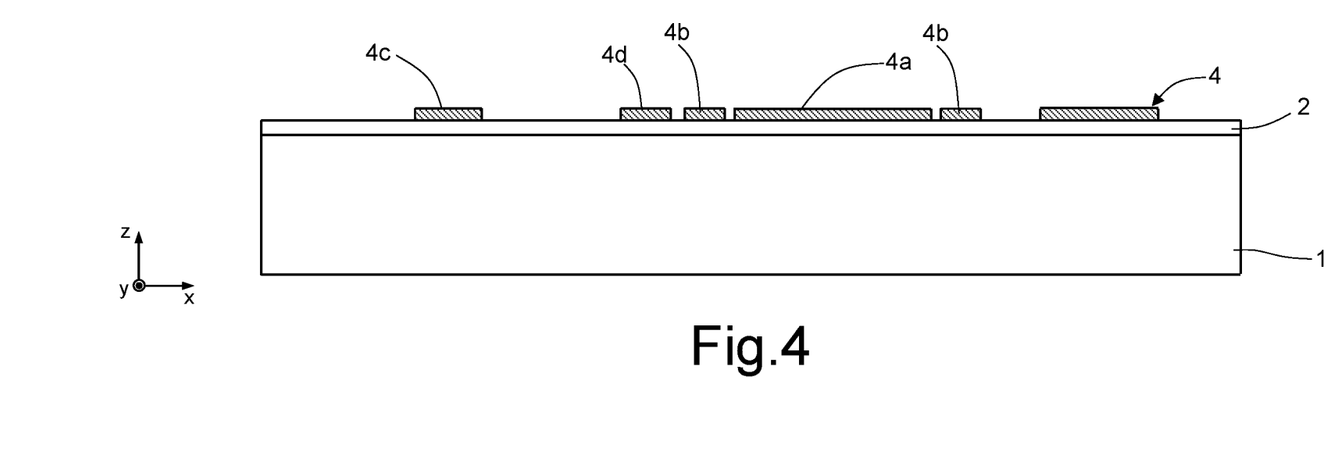
FIGS. 4-9 show steps for manufacturing the transducer module of FIG. 1.

With reference to FIG. 4, the substrate 1, for example of semiconductor material such as silicon, is provided. The supporting layer 2 is formed, for example of dielectric material such as thermally grown or deposited silicon oxide on the substrate. The supporting layer 2 is also known as permanent-oxide or field-oxide layer and has, for example, a thickness comprised approximately between 2 and 3 μm. The supporting layer 2 has a supporting function for overlying structures (formed in subsequent steps) and is designed to reduce the parasitic capacitance between said overlying structures and the underlying substrate 1.

Formed on the supporting layer 2 is a layer of doped polysilicon (for example, with a N type doping) that forms the electrical-connection region 4 described previously. A subsequent lithographic and etching step enables removal of selective portions of the polysilicon layer and shaping of the conductive strips 4c, 4d and, simultaneously, of the region that, in subsequent manufacturing steps, will form the suspended membrane 4a (in this step, also the membrane 4a' of the embodiment of FIG. 3 is formed). Etching of the polysilicon layer 4 is of a selective type and does not remove portions of the supporting layer 2.

It is here pointed out that, during the step of photolithographic definition of the polysilicon layer to form the electrical-connection region 4, it is possible to form at the same time the openings 62 described with reference to FIG. 3, i.e., the holes of the membrane 4a' of the reference transducer.

Figure 5:
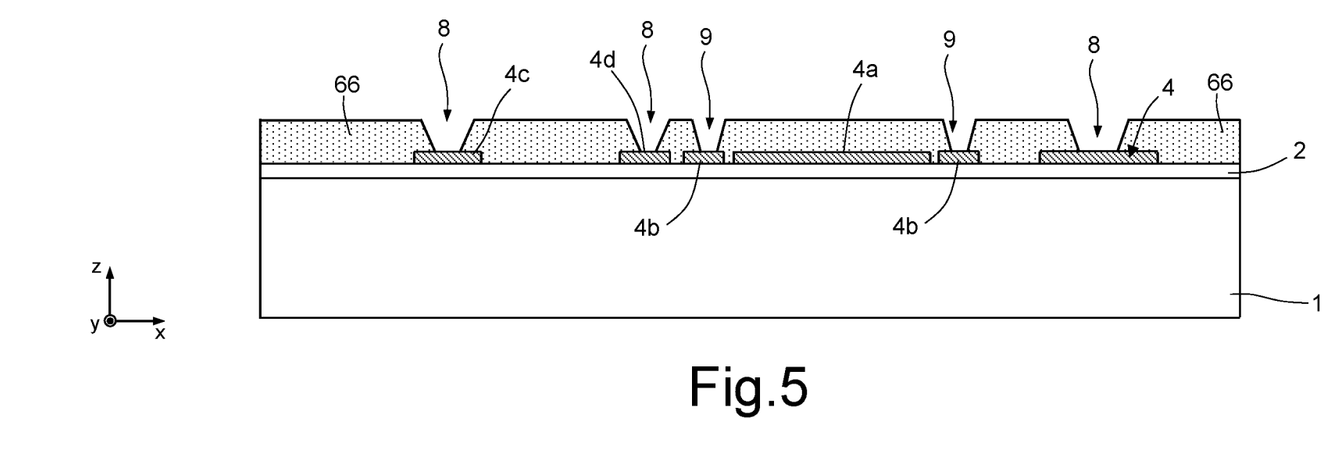

As shown in FIG. 5, formed (for example with the PECVD technique) over the supporting layer 2 and the electrical-connection region 4 is a sacrificial layer 66, of silicon oxide. Via steps of lithography and subsequent etching, portions of the sacrificial layer 66 are removed in areas corresponding to selective regions of the conductive strips 4c, 4d, to form a plurality of trenches 8 that extend as far as the conductive strips 4c, 4d, so as to expose respective surface portions.

There are further formed trenches 9, used for subsequent formation of anchorage regions of the top plate 6 of the second transducer 30 to the substrate 1 (more precisely, to the supporting layer 2 that extends over the substrate 1). In general, the trenches 9 may extend as far as the underlying supporting layer 2, or stop before and thus extend only partially in the sacrificial layer 66. Etching of the sacrificial layer 66 may be stopped in a region close to the interface between the sacrificial layer 66 and the supporting layer 2, if the etching rate is known, by monitoring the etching time; alternatively, it is possible to provide an etch-stop layer, arranged between the sacrificial layer 66 and the supporting layer 2.

Figure 6:
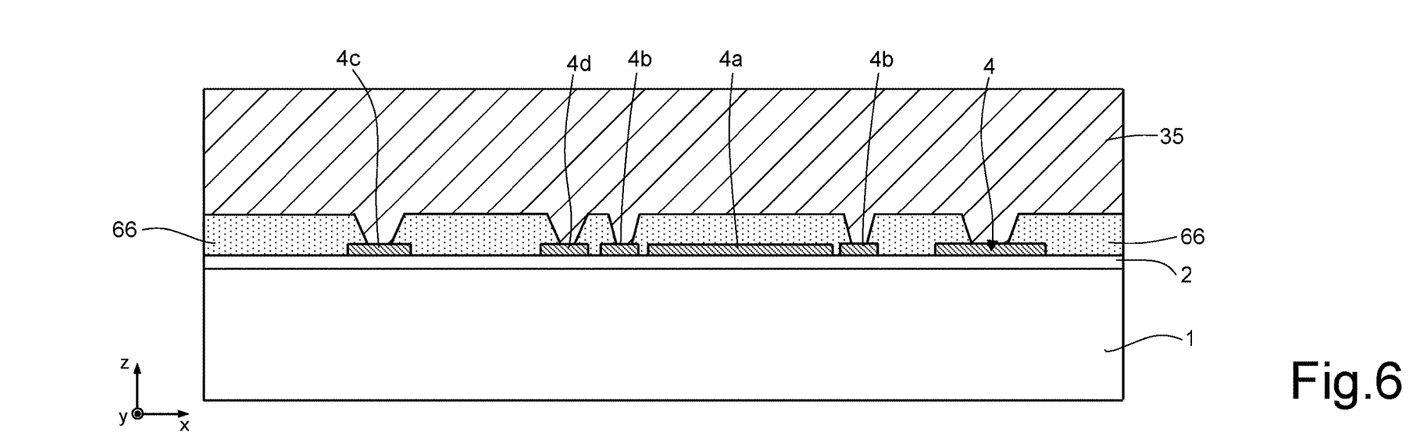
Figure 7:
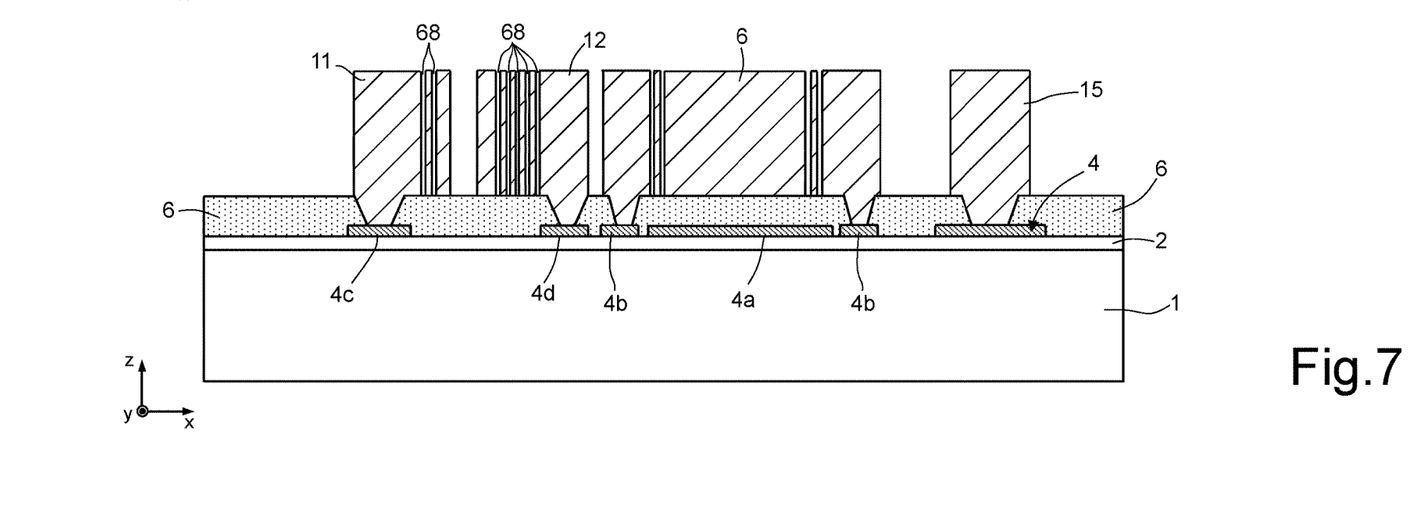

As shown in FIG. 6, formed on the sacrificial layer 66 and in the trenches 8 is the structural layer 35, for example of epitaxial polysilicon (also known as EPIPoly). The structural layer 35, of a thickness comprised, for example, between 15 μm and 30 μm, may be shaped according to the need, to form structures having a desired conformation.

In particular, in FIG. 6, the structural layer 35 is etched selectively to form suspended structures that are mobile in one or more directions (namely, the stator 11 and the rotor 12 of the first transducer 20; the top plate 6 of the second transducer 30; and the suspended structure—not illustrated—mobile in one or more directions of the third transducer 50). In this step, the top plate 6 belonging to the reference transducer 60 shown in FIG. 3 is further formed. In addition, also the electrical contact terminals 15 are formed.

However, it is pointed out that, in this manufacturing step, the stator 11 and the rotor 12 are still constrained to the underlying sacrificial layer 66, and thus are not free to perform movements. To enable removal of the sacrificial layer 66 that constrains the stator 11 and the rotor 12, through the structure of the stator 11 and of the rotor 12, through holes 68 are further formed.

Similar holes, once again designated by the reference 68, are also formed through the structure of the top plate 6 of the second transducer 30 (and further in the mobile structure of the third transducer 50, according to the respective embodiment) to enable removal, in subsequent manufacturing steps, of the underlying sacrificial layer 66.

Figure 8:
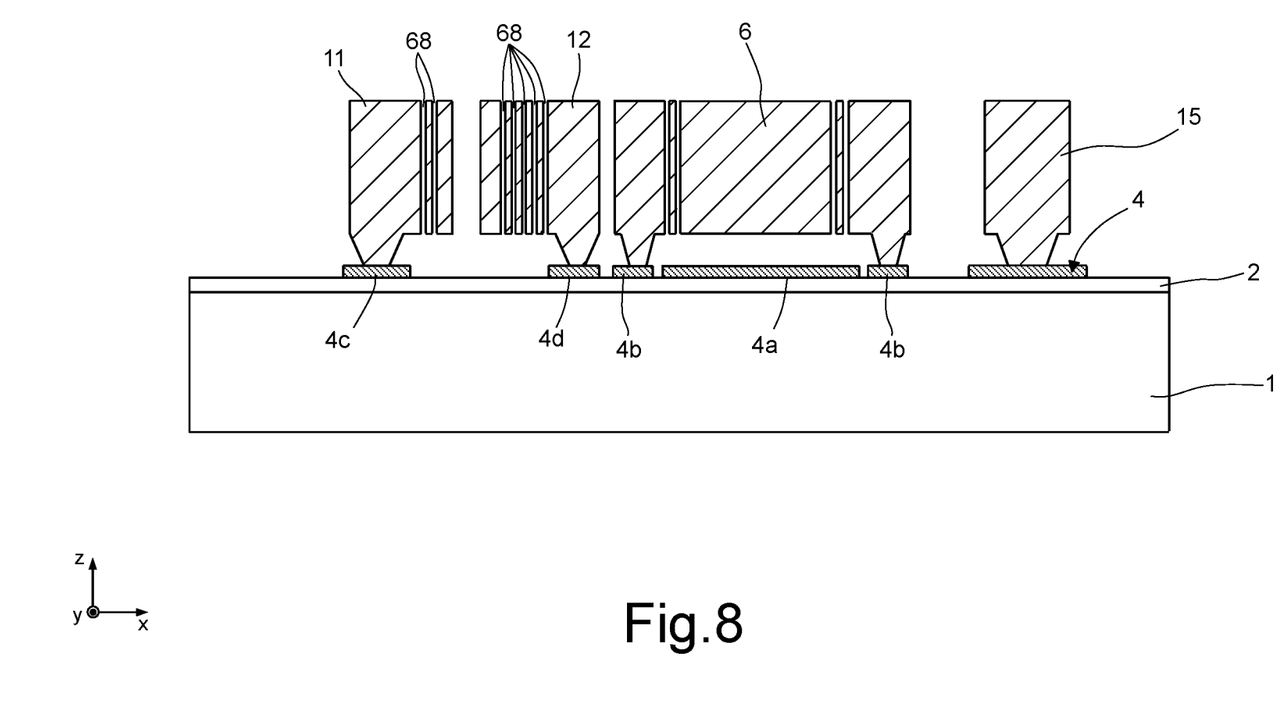

As shown in FIG. 8, an etching step is carried out to remove the sacrificial layer 66 (here, of silicon oxide). This etch is typically an etch using hydrofluoric acid (HF) in the vapor phase or, alternatively, a wet etch using an HF solution or mixture. The hydrofluoric acid etches the silicon oxide in an isotropic way, but not the polysilicon. The structures defined previously of the first and second transducers 20, 30 are, consequently, not deteriorated. Etching of the sacrificial layer 66 using HF may be stopped in a region close to the interface between the sacrificial layer 66 and the supporting layer 2, if the etching rate is known, by monitoring the etching time; alternatively, it is possible to provide an etch-stop layer, arranged between the sacrificial layer 6 and the supporting layer 2, chosen of a material that is not etched by HF and does not allow penetration of HF.

Figure 9:
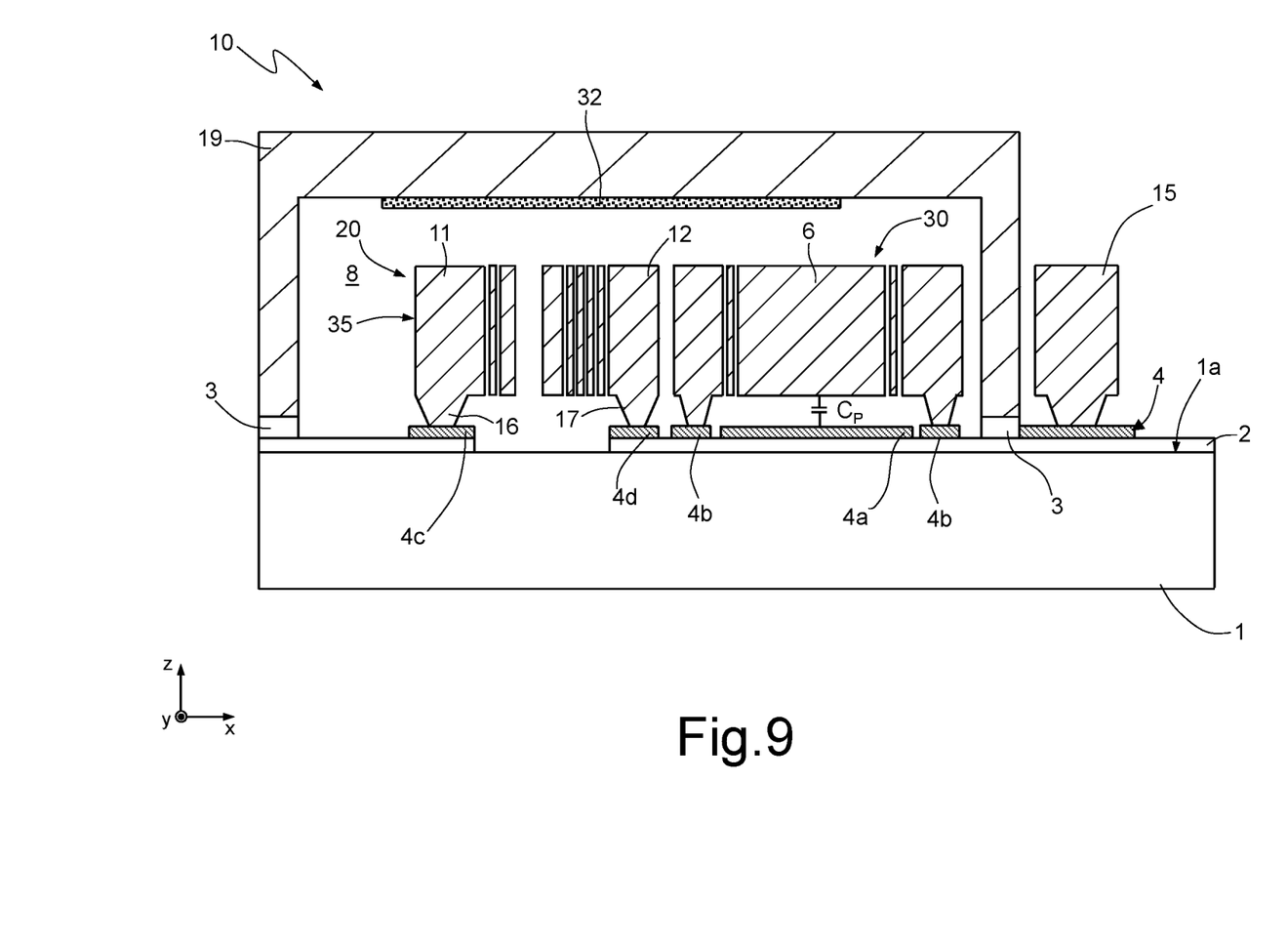

As shown in FIG. 9, the manufacture of the transducer module 10 proceeds by coupling the cap 19 to the substrate 1, in a per se known manner. In this way, the chamber 8 (and the chamber 42, in the respective embodiment) is isolated from the external environment. Outside the chamber 8 (and 42, when present), as has been said, electrical contact terminals 15 are present designed to receive/supply electrical signals to/from the first 20, second 30 (and third 50) transducers.

By etching from the back of the wafer, the holes 9 are formed in the substrate 1, in a position corresponding to the conductive region 4 in which the membrane is to be formed (i.e., underneath the top plate 6 of the second transducer 30). For this purpose, etching of the silicon of the substrate 1 is first carried out to form openings that expose respective portions of the supporting layer 2. Etching (for example, in HF) of the supporting layer 2 exposed through the openings formed in the substrate 1 enables selective removal of the supporting layer 2, thus releasing and forming the membrane 4a. The transducer module 10 of FIG. 1A is thus obtained.

Figure 10:
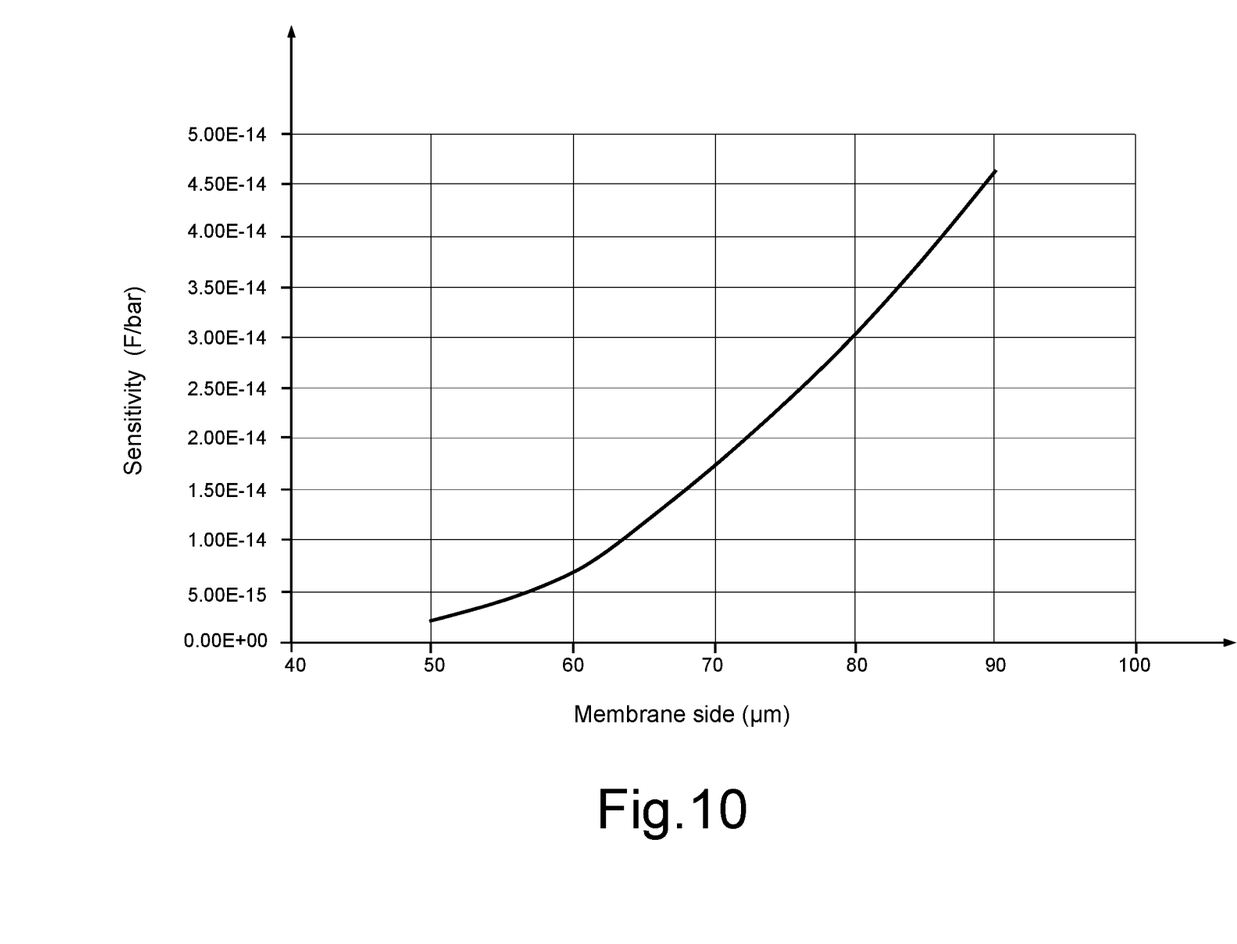
FIG. 10 represents the variation of sensitivity of a membrane-based capacitive pressure sensor, belonging to the transducer module according to any one of the embodiments of FIGS. 1-3, as a function of the dimension of the side of the membrane itself.

FIG. 10 illustrates the variation of the sensitivity of the second transducer 30 (pressure sensor) as a function of the size of the membrane 4a. In this example, a membrane 4a of a square shape is considered (the axis of the abscissae thus represents the length of one side of the membrane). The present applicant has found that a compromise choice to obtain an adequate sensitivity without an excessive increase in the occupation of space envisages a membrane 4a with a side of, for example, approximately 80 μm.

Figure 11:
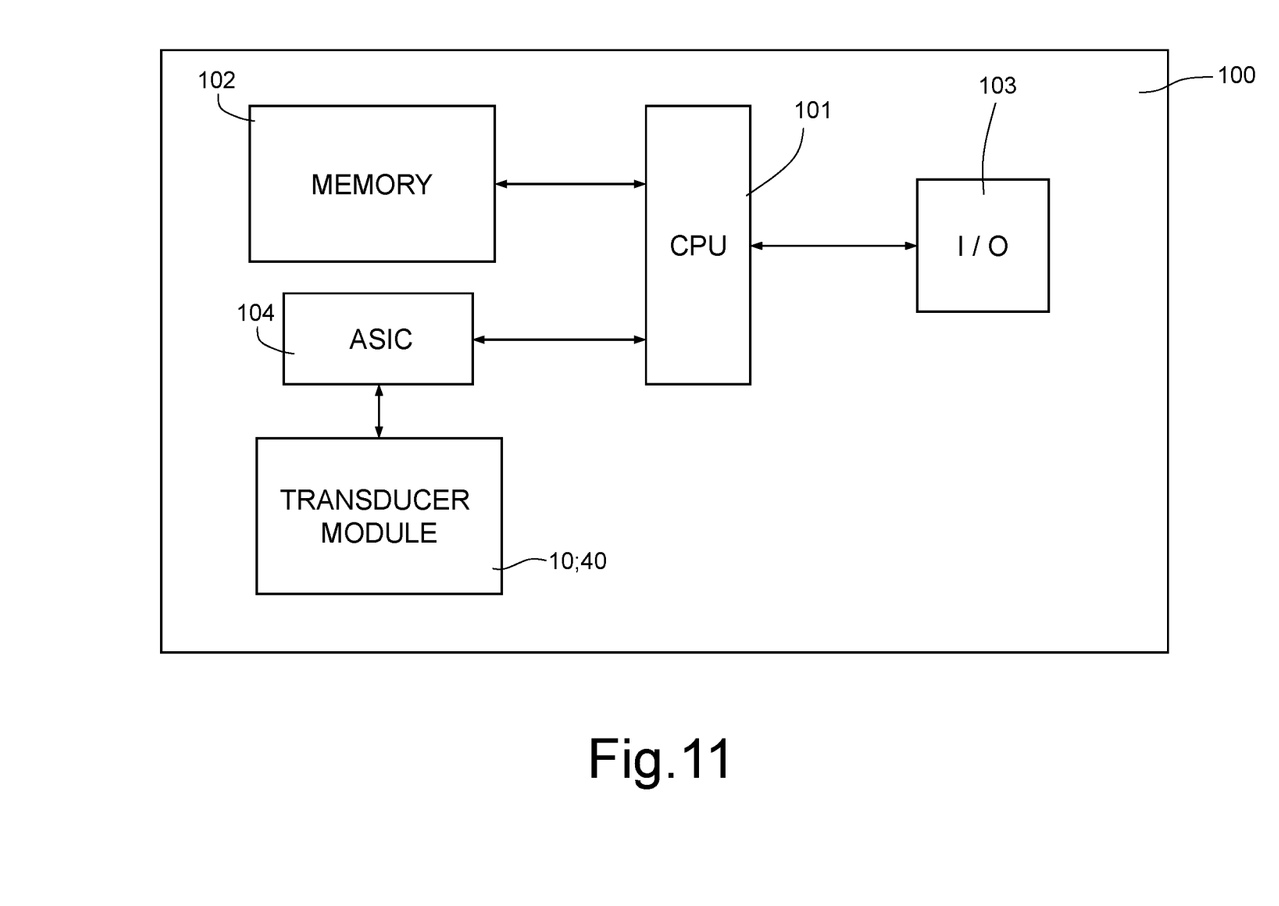
FIG. 11 is a schematic illustration of an electronic apparatus including a transducer module according to any one of the embodiments of FIGS. 1-3.

FIG. 11 shows an electronic device 100 that uses the transducer module according to any of the embodiments described previously.

The electronic device 100 comprises, in addition to the transducer module 10 or 40 according to the respective embodiment described, a microprocessor (CPU) 101, a memory block 102, connected to the microprocessor 101, and an input/output interface 103, for example a keypad and/or a display, which is also connected to the microprocessor 101. An ASIC 104 may be integrated in the transducer module 10 or 40 or, as illustrated in FIG. 11, arranged outside the transducer module 10, 40 and operatively coupled thereto.

The transducer module 10, 40 communicates with the microprocessor 101 via the ASIC.

The electronic device 100 is, for example, a mobile communication device, such as a cellphone or smartphone, a PDA, or a computer, but may also be a voice recorder, a player of audio files with voice-recording capacity, a console for videogames, etc.

The advantages of the disclosure described previously, according to the various embodiments, emerge clearly from the foregoing description.

In particular, the present description discloses a transducer module that may be adapted to different configurations according to the need, at the same time reducing the costs and specifications of space, maximizing sharing of the structures between the components.

The presence of the pressure sensor in the same chamber as that of the gyroscope may be useful for detecting a possible loss of tightness of the chamber (when the internal pressure is equal to the external pressure).

Finally, it is clear that modifications and variations may be made to what has been described and illustrated herein, without thereby departing from the scope of the present disclosure.

In particular, there may be provided different configurations of the transducers described and illustrated in the figures, in particular as regards the geometrical shape of the constitutive elements. In the case where the space inside the package so allows, even a number of MEMS sensors or transducers higher than what has been illustrated herein may possibly be housed within a same package, each transducer being configured to detect a respective environmental quantity or signal.

According to further variants of the present disclosure, at least one of the first and third transducers 20, 50 of FIGS. 1 and 2 may be replaced by a transducer of a different type, for example chosen in the group comprising: a UV sensor, an IR sensor, or a light-signal sensor (e.g., a photodiode). It is evident that, in the case of use of a transducer of a UV or IR type, a through opening in the cap 19 or substrate 1 is provided, configured to form an input for the light radiation impinging on a sensitive area of the respective transducer.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method comprising:
    forming a conductive layer on a substrate, the conductive layer including at least a first portion and a second portion that are electrically isolated from each other;
    forming, over the substrate and the first portion of the conductive layer, a first MEMS transducer subjected, in use, to a first environmental stimulus and configured to generate a first transduced signal as a function of the first environmental stimulus, the first portion of the conductive layer being a conductive strip that is electrically coupled to the first MEMS transducer;
    forming, over the substrate and the second portion of the conductive layer, a second MEMS transducer having a membrane suspended over the substrate and configured to detect an environmental quantity and generate a second transduced signal as a function of the environmental quantity detected, the second portion of the conductive layer forming the membrane; and
    coupling a cap to the substrate, the cap having a recess that forms a first chamber with the substrate, the first chamber housing the first and second MEMS transducers.

2. The method according to claim 1, wherein the first MEMS transducer is an inertial sensor, and the second MEMS transducer is a pressure sensor.

3. The method according to claim 2, wherein the pressure sensor is a capacitive sensor including a conductive plate capacitively coupled to the membrane.

4. The method according to claim 1, wherein forming the conductive layer includes:
    depositing doped polysilicon, and
    etching the doped polysilicon to form the first and second portions of the conductive layer.

5. The method according to claim 1, wherein forming the second MEMS transducer includes removing selective portions of the substrate in an area corresponding to the second portion of the conductive layer and thereby suspending the membrane to allow movement in at least one direction.

6. The method according to claim 1, further comprising:
forming a sacrificial layer over the conductive layer;
removing selective portions of the sacrificial layer in areas of anchorage to the substrate and to the conductive strip;
forming a structural layer of doped semiconductor material above the sacrificial layer and in the areas of anchorage to the substrate and to the conductive strip;
shaping the structural layer to form microelectromechanical structural elements of the first MEMS transducer and of the second MEMS transducer; and
removing at least in part the sacrificial layer so as to release and at least partially suspend the structural over the substrate.

7. The method according to claim 1, further comprising forming an electrical-contact pad, and wherein forming the conductive layer includes forming an electrical connection between the first MEMS transducer and the electrical-contact pad.

8. The method according to claim 1, wherein the cap further has a second recess that forms a second chamber with the substrate, the second chamber being isolated from the first chamber, the method further comprising forming, on the substrate in an area corresponding to said second chamber, a third MEMS transducer subjected, in use, to a second environmental stimulus and configured to generate a third transduced signal as a function of the second environmental stimulus.

9. The method according to claim 8, wherein forming the first transducer includes forming one between a gyroscope and an accelerometer, forming the third transducer includes forming the other between a gyroscope and an accelerometer, and forming said second transducer includes forming a pressure sensor.

10. A transducer module, comprising:
a supporting substrate;
a conductive strip and a suspended membrane coupled to the support substrate, the conductive strip and the suspended membrane being of a same material and coplanar;
a first MEMS transducer coupled to the supporting substrate and subjected, in use, to a first environmental stimulus and configured to generate a first transduced signal as a function of the first environmental stimulus, the conductive strip electrically coupled to the first MEMS transducer and configured to convey, in use, the first transduced signal;
a second MEMS transducer coupled to the supporting substrate, the second MEMS transducer including the suspended membrane and being configured to detect an environmental quantity and generate a second transduced signal as a function of the environmental quantity detected; and
a cap over the supporting substrate, the cap and the supporting substrate defining a first chamber having an internal pressure, the supporting substrate having one or more through openings in an area corresponding to the suspended membrane, wherein the suspended membrane is configured to deflect as a function of a difference between the internal pressure and a pressure outside the first chamber.

11. The transducer module according to claim 10, wherein the first MEMS transducer is an inertial sensor, and the second MEMS transducer is a pressure sensor.

12. The transducer module according to claim 11, wherein the pressure sensor is a capacitive sensor including a conductive plate capacitively coupled to the suspended membrane.

13. The transducer module according to claim 10, wherein the material of the conductive strip and the suspended is doped polysilicon.

14. The transducer module according to claim 10, wherein the suspended membrane is located over a through opening of the supporting substrate and mobile in at least one direction.

15. The transducer module according to claim 10, further comprising an electrical-contact pad electrically coupled to the conductive strip so as to be in electrical connection with the first MEMS transducer.

16. The transducer module according to claim 10, further comprising a reference transducer of a same type as the second MEMS transducer, the reference transducer being in the first chamber and having a respective perforated suspended membrane suspended over a portion of the supporting substrate that does not include through holes so as to generate a reference error signal that is a function of mechanical stresses and is not affected by the internal pressure and the pressure outside the first chamber.

17. The transducer module according to claim 10, further comprising a getter element inside the first chamber, the getter element being configured to generate, when activated, the internal pressure.

18. The transducer module according to claim 10, wherein the cap and the supporting substrate further form a second chamber that is isolated from the first chamber, the second chamber housing a third MEMS transducer subjected, in use, to a second environmental stimulus and configured to generate a third transduced signal as a function of the second environmental stimulus.

19. The transducer module according to claim 18, wherein the first transducer is one between a gyroscope and an accelerometer, the third transducer is the other between a gyroscope and an accelerometer, and the second transducer is a pressure sensor.

20. An electronic apparatus, comprising:
a microprocessor; and
a transducer module operatively coupled to the microprocessor, the transducer module including:
a substrate;
a conductive strip and a suspended membrane coupled to the support substrate, the conductive strip and the suspended membrane being coplanar;
a first MEMS transducer coupled to the conductive strip and supporting substrate and subjected, in use, to a first environmental stimulus and configured to generate a first transduced signal as a function of the first environmental stimulus, the conductive strip being configured to convey, in use, the first transduced signal;
a second MEMS transducer coupled to the supporting substrate, the second MEMS transducer including the suspended membrane and being configured to detect an environmental quantity and generate a second transduced signal as a function of the environmental quantity detected; and
a cap coupled to the substrate, the cap forming a chamber with the substrate, the first and second MEMS transducers located in the chamber.

21. The electronic apparatus according to claim 20, wherein the electronic apparatus is at least one of a cellphone, a smartphone, a personal digital assistant, a notebook, a computer, a voice recorder, an audio player, and a console for videogames.

22. The electronic apparatus according to claim 20, wherein the chamber is a first chamber, the cap forming a second chamber with the substrate, the second chamber being isolated from the first chamber, a third MEMS transducer locate in the second chamber.

23. The electronic apparatus according to claim 20, wherein the second MEMS transducer is a pressure sensor and the first MEMS transducer is an accelerometer or a gyroscope.

* * * * *